United States Patent [19]
Yamada

[11] Patent Number: 4,999,337
[45] Date of Patent: Mar. 12, 1991

[54] SUPERCONDUCTIVE TRANSISTOR

[75] Inventor: Takahiro Yamada, Hirakata, Japan

[73] Assignee: Matsushita Electric Industrial Co., Ltd., Osaka, Japan

[21] Appl. No.: 306,751

[22] Filed: Feb. 6, 1989

[30] Foreign Application Priority Data

Mar. 3, 1988 [JP] Japan ................................ 63-49981

[51] Int. Cl.⁵ .................... H01B 12/00; H01L 39/22; H01L 27/00; H01L 45/00
[52] U.S. Cl. .......................................... 505/1; 357/4; 357/5; 357/23.7; 357/22
[58] Field of Search ................. 357/5, 4, 23.7, 22; 505/1

[56] References Cited

U.S. PATENT DOCUMENTS

| | | | |
|---|---|---|---|
| 4,538,167 | 8/1985 | Yoshino et al. | 357/23.7 |
| 4,647,954 | 3/1987 | Graf et al. | 357/4 |
| 4,675,711 | 6/1987 | Harder et al. | 357/22 |
| 4,884,111 | 11/1989 | Nishino et al. | 357/4 |
| 4,888,629 | 12/1989 | Harada et al. | 357/5 |
| 4,916,500 | 4/1990 | Yazawa et al. | 357/23.7 |

OTHER PUBLICATIONS

"Principles of CMOS VLSI Design", Neile Weste et al., 1985, pp. 8-9.
"Superconductivity at 93K in a New Mixed-Phase Y-Ba-Cu-O Compound System at Ambient Pressure", Wu et al, Phys. Rev. Lett., vol. 58, #9, pp. 908-910.

Primary Examiner—Rolf Hille
Assistant Examiner—Mahshid Saadat
Attorney, Agent, or Firm—Wenderoth, Lind & Ponack

[57] ABSTRACT

A superconductive transistor in which a complementary circuit is composed of semiconductor materials having pn junctions, that is, pnp type transistor and npn type transistor, and wiring is formed by using superconductive materials. As a result, the on/off conduction control by making use of the tunneling effect of pn junctions is possible, and a superconductive transistor having a least change of generating quasiparticles can be presented.

2 Claims, 11 Drawing Sheets

C-ST

V-ST

FIG. 13A
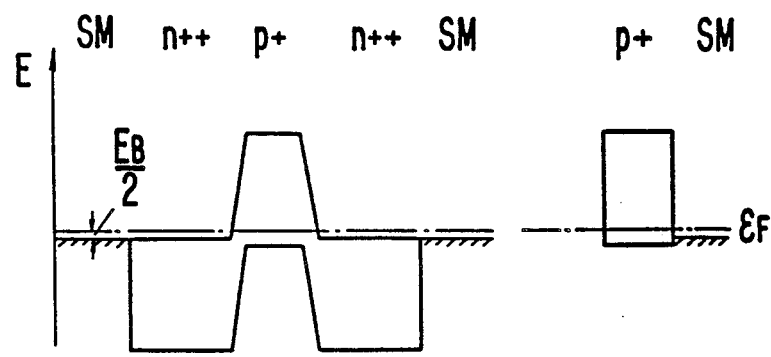
FIG. 13B
FIG. 13C
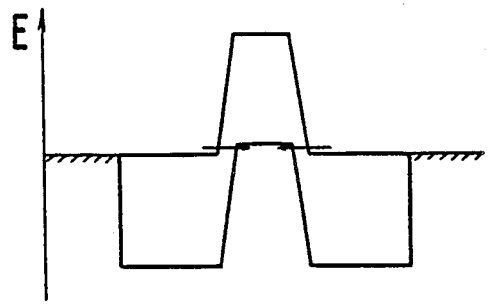
FIG. 14
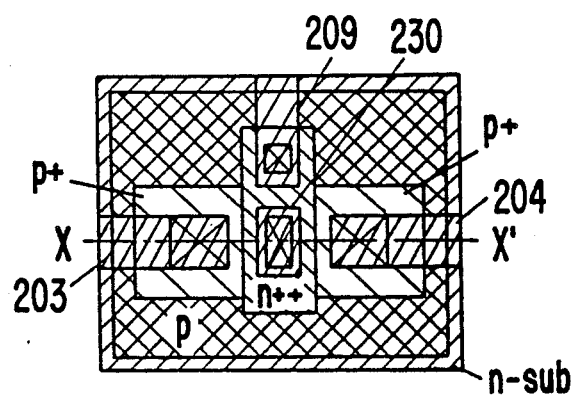
FIG. 15
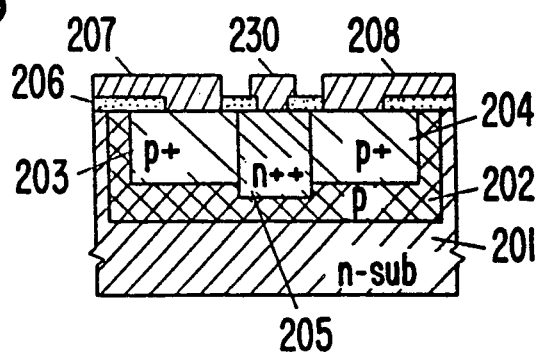

$|V_{DD}| \leq |V_{SS}|$

SUPERCONDUCTIVE TRANSISTOR

BACKGROUND OF THE INVENTION

This invention relates to a superconductive transistor for controlling the tunneling effects of superconductive electron or hole by a gate voltage.

In the existing Josephson device using a superconductive tunnel current (e.g. B. D. Josephson: Possible new effects in superconductive tunneling, "Phys. Lett"., vol. 1, p. 251, 1962), because of the latch theory, the negation logic was difficult, and a pulse power supply was needed. As a result, in spite of the high speed (several picoseconds) and low power consumption that are not expected to be realized in semiconductors, a useable clock for such a system was 2 or 3 nsec, and it was difficult to exhibit a sufficiently high speed. Furthermore, the length "l" of the device determined by the minimum unit 2 fWb of the magnetic flux (fluxoid) to control the device state was more than 14 μm, and the degree of integration was far lower than that of semiconductors.

In such a situation, a superconductor having an occupancy area advantageous for a high degree of integration and possessing three terminals has been proposed.

A typical example of this is a Josephson FET (e.g. T. B. Back et al.: Feasibility of hybrid Josephson field effect transistor, Jour. Appl. Phys., vol. 51, No. 5, pp. 2736–2743, 1980).

According to this example, as shown in FIG. 1, a source 402 and a drain 404 made of superconductive materials are formed on the surface of a semiconductor substrate 401, and a gate 403 is disposed between the source and drain.

The superconductive materials of source 402 and drain 404 produce a bonding energy of $$\Delta E = -E_0 \cos \phi (\text{max. if } \phi=0) \ldots \quad (1)$$

which depends on the phase difference between these two superconductors. In the structure shown in FIG. 1, since $\phi \neq 0$, it is called a weak bonding (energy) Josephson device.

In this structure, by forming a depletion layer 405 beneath the gate 403, it is possible to decrease the superconductive current i.

Energy band diagrams corresponding to the structure of FIG. 1 are shown in FIGS. 2A to 2D. FIGS. 2A and 2B are an energy band diagram and a bonding energy profile when the voltage applied to the gate 403 is zero and the superconductive electron pair tunnels between the source and drain, and FIGS. 2C and 2D are an energy band diagram and a bonding energy profile when a voltage is applied to the gate 403 to produce the depletion layer 405, and the tunneling probability of the superconductive electron pair between the source and drain is decreased.

The length (coherence length) $\xi_N$ of the wave function of the superconductive electron pair invading into the semiconductor expresses the degree of vagueness of the location of the electron pair determined by the uncertainty theory, and is formulated as follows.

$$\xi_N = 0.15 \times \frac{h v_F}{k_B T_C} \quad (2)$$

$$v_F = \frac{h}{m} (3\pi^2 \rho)^{\frac{1}{3}} \quad (3)$$

where $T_C$: transition temperature
$v_F$: Fermi velocity
$\rho$: electron density FIG. 2B shows the realization of weak bond enabling tunneling of the superconductive electron pair as the coherence lengths $\xi_N$ of source 402 and drain 404 cross over within the semiconductor substrate 401.

On the other hand, when the depletion layer 405 is formed, the electron density $\rho$ in this region drops, and the value of $v_F$ becomes smaller than that in equation (3), and $\xi_N$ in equation (2) becomes also smaller to be $\xi_N'$, then the weak bond is broken as shown in FIG. 2D (it may be considered that the height of the valence band of the semiconductor substrate as seen from the superconductive electron pair is increased, and the tunneling probability is lowered).

In such structure, however, it is necessary to define the impurity concentration of semiconductor substrate within $10^{18}$ to $10^{19}$ cm$^{-3}$ (at this time, the spacing L between source and drain in FIG. 1 becomes about 0.2 μm), and the gate voltage necessary for formation of depletion layer 405 becomes high, e.g. several volts, so that the difference is too much from the operating voltage (several millivolts) of the superconductive device. As a result, quasiparticles (ordinary conductive electrons set free from the pair by excitation of superconductive electron pair) intrude in the form of leakage current in the integrated circuit, and the operating speed may be lowered. (This is because the life of quasiparticles is on order of hundreds of picoseconds, being extremely slow as compared with the speed of 1 picosecond of the Josephson device.) Furthermore, in the ordinary circuit operation, since there is always a potential difference between the drain and source, a stationary AC Josephson effect takes place, which also leads to formation of quasiparticles. Summing up the problems to be solved, in order to maintain the superhigh speed operation by making use of superconduction, it is important to suppress as far as possible the generation of quasiparticles of the voltage-driven, three-terminal superconductive transistor.

SUMMARY OF THE INVENTION

It is hence a primary object of this invention to present a voltage-driven, three-terminal superconductive device capable of sufficiently exhibiting the superhigh speed operation of Josephson device even in an integrated circuit, while reducing the generator of quasiparticles.

It is another object of the present invention to operate such a device at room temperature (at this time, supposing a range of 100° C. from the room temperature, the energy gap $E_B$ caused by Bose condensation of the superconductive electron pair of the superconductive material is about 60 to 120 mV, or in the superconductive material of 10° K., $E_B$ is about 2 to 3 mV).

It is another object of the present invention to present a superconductive transistor for inducing conduction between a source region and a drain region by the tunneling effect occurring at two positions between the source and gate, and between the drain and source, when a voltage corresponding to the energy gap of high temperature superconductive materials is applied to the gate region, disposing the gate region of a second conductive type at high impurity concentration between the source region and drain region of a first conductive type at high impurity concentration, and using high temperature superconductive materials for the electrodes of the source, gate and drain.

According to the present invention as described herein, the following benefits, among others, are obtained.

Since this invention realizes the phase draw-in of the superconductive electron pair of source and drain by causing interaction by generating tunneling effects between the source and gate, and between the drain and gate by applying a voltage, an on/off action without causing quasiparticles is possible, and the high speed operation on the order of T Hz and low power consumption around n W/gate can be exhibited to the full extent, and high integration is possible by a similar designing technique as in a CMOS circuit, which brings about extremely practical effects.

Besides, since the basic circuit in this invention is complementary in the same fashion as in a CMOS circuit, there is no generation of quasiparticles at points other than the transition of on/off switching, and the superhigh speed operation of the superconductive device may be realized.

While the novel features of the invention are set forth in the appended claims, the invention, both as to organization and content, will be better understood and appreciated, along with other objects and features thereof, from the following detailed description taken in conjunction with the drawings.

BRIEF DESCRIPTION OF THE DRAWINGS

FIG. 2A is an energy band diagram when the Josephson FET is turned on;

FIG. 13A and 13B are energy band diagrams in thermal balance state;

FIG. 13C is an energy band diagram in an ON state;

FIG. 14 is a plan view of a C-ST having a floating superconductive electrode disposed in a gate region;

FIG. 15 is a sectional view of X—X' of FIG. 14;

FIG. 23C is an energy band diagram on the moment of a C-ST becoming ON;

DETAILED DESCRIPTION OF THE INVENTION

Figure 1:
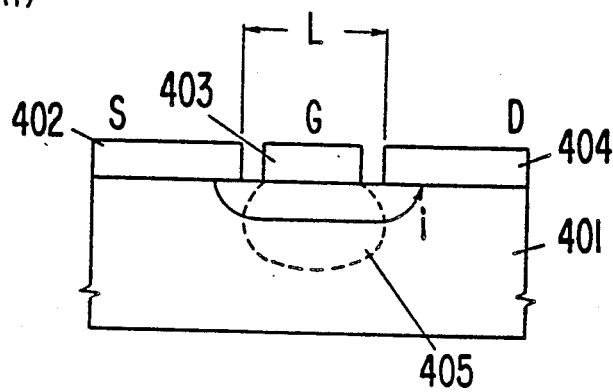
FIG. 1 is a sectional view of a conventional Josephson FET.
Figure 2A:
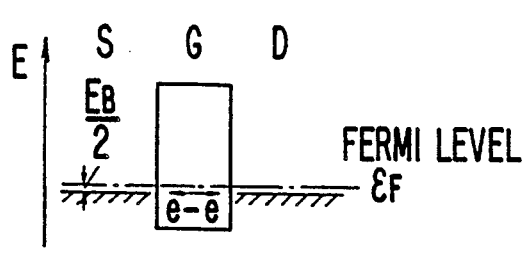
Figure 2B:
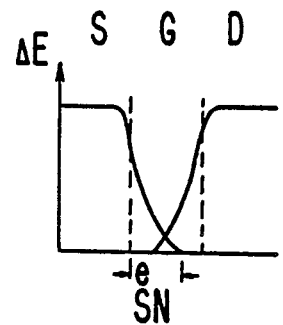
FIG. 2B is a bonding energy distribution diagram in an ON state.
Figure 2C:
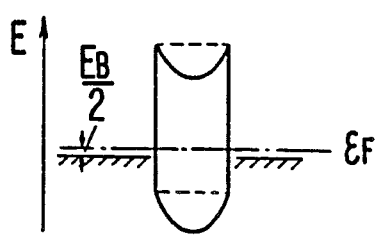
FIG. 2C is an energy band diagram in an OFF state.
Figure 2D:
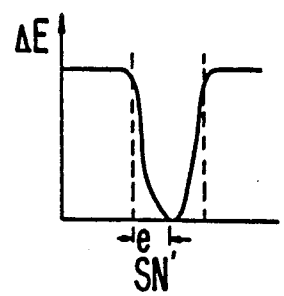
FIG. 2D is a bonding energy distribution diagram in an OFF state.
Figure 3:
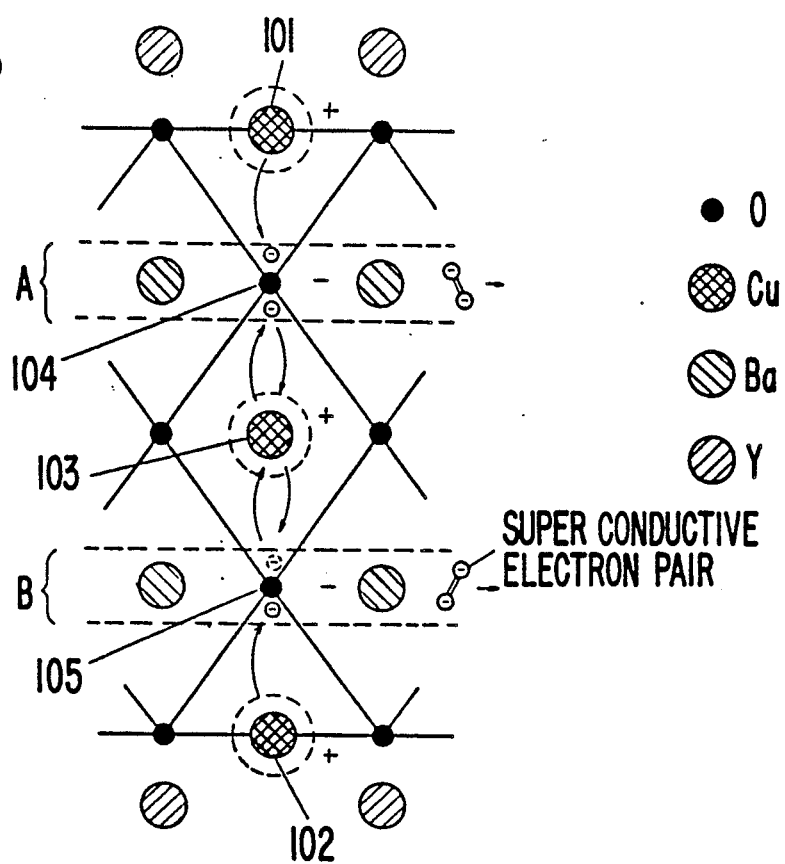
FIG. 3 is an atomic array model diagram of a high temperature superconductive material used in this invention for composing an electron pair.
Figure 4:
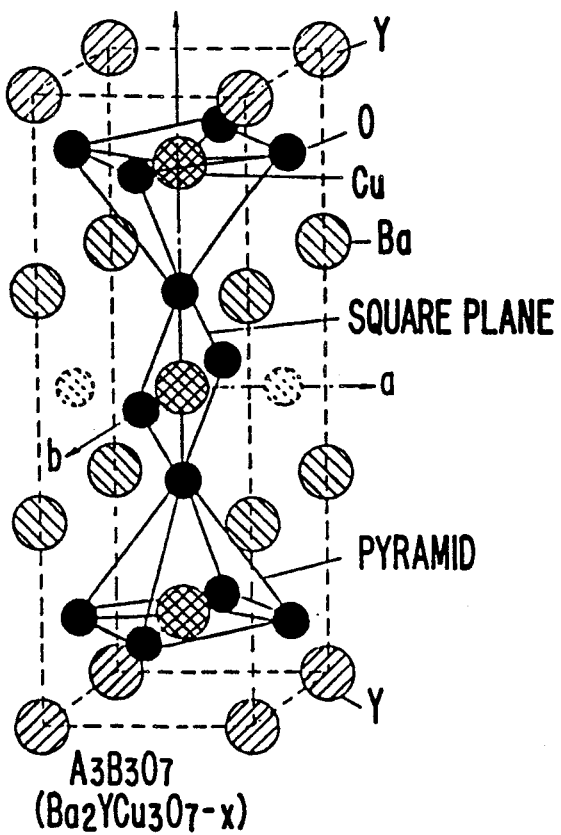
FIG. 4 is its solid model diagram.
Figure 5:
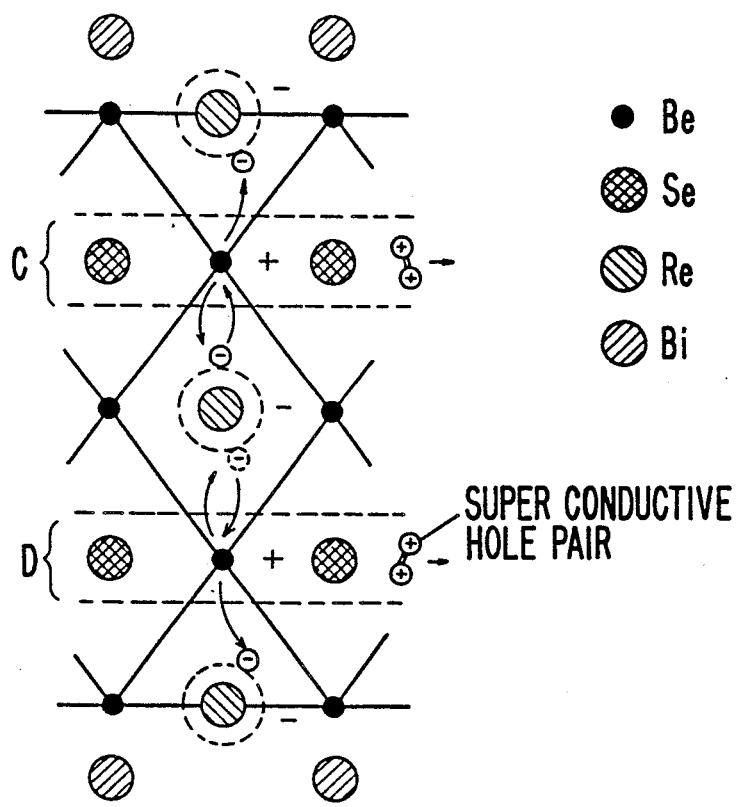
FIG. 5 is an atomic array model diagram of the material for composing a hole pair.

FIGS. 3 to 5 show superconductive materials used in this invention. FIG. 3 refers to a Y-Ba-Cu-O compound, in which the material is a superconductor even at 100° K., and the energy gap $E_B$ is about 20 to 30 mV (e.g. Wu, M. K. et al.: Superconductivity at 93 K in a New Mixed-Phase Y-Ba-Cu-O Compound System at Ambient Pressure, Phys. Rev. Lett., vol. 58, No. 9, pp. 908-910, 1987).

In FIG. 3, Cu atoms of 101 and 102 make up a pyramid configuration by $CuO_5$ of 5 coordinations. On the other hand, the Cu atom of 103 make up an octahedral configuration by $CuO_6$ of 6 coordinations, but it can also make up a square plane configuration by $CuO_4$ of 4 coordinations. These configurations are shown in FIG. 4.

The mechanism of expression of superconductivity is considered to be a coexistence of an excitor mechanism and a phonon mechanism. The phonon mechanism has been explained in the conventional BCS theory, and the excitor mechanism is briefly described below. When Cu of 101 and Cu of 103 transfer their electrons to O of 104, Cu atoms are positively charged, while O is negatively charged, and as a result Cu of 101, O of 104 and Cu of 103, O of 104 compose excitors. By these excitors, the free electrons existing in region A exhibit an attraction to form electron pairs, thereby inducing Bose condensation to express superconductivity. The free electrons in region B similarly form superconductive electron pairs.

Meanwhile, as a twin pair form of FIG. 3, Bi-Re-Se-Be compound system forming superconductive hole pairs in both region C and region D may be formed as shown in FIG. 5.

FIGS. 6 to 19C illustrate the structure and energy band diagrams of a superconductive transistor in accordance with a first embodiment of the present invention.

Figure 6:
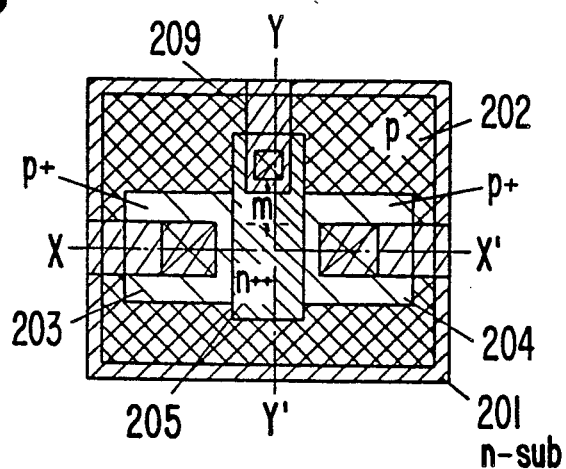
FIG. 6 is a plan view of C-ST in accordance with a first embodiment of the present invention.
Figure 7:
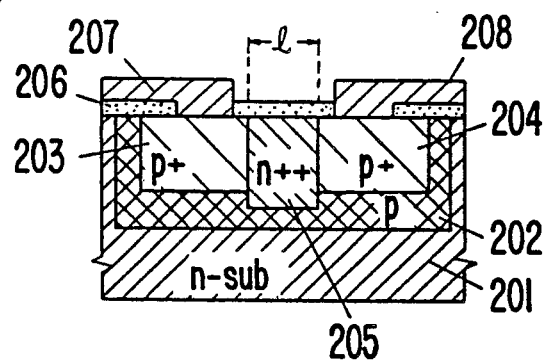
FIG. 7 is a sectional view of X—X' of FIG. 6.
Figure 8:
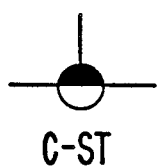
FIG. 8 is a sketch of a display symbol.
Figures 9A, 9B:
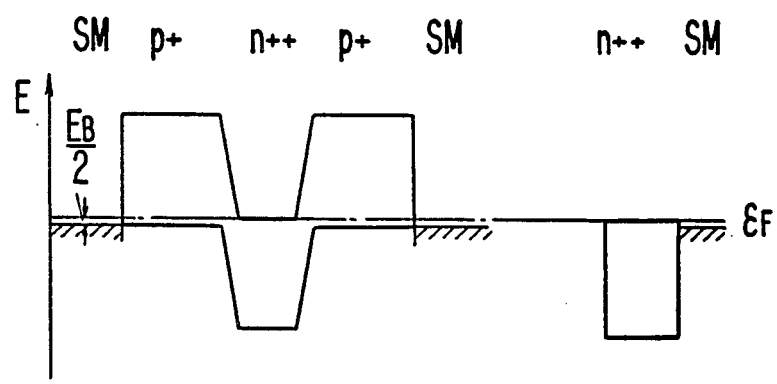
FIGS. 9A, 9B are energy band diagrams in a thermal balance state.
Figure 9C:
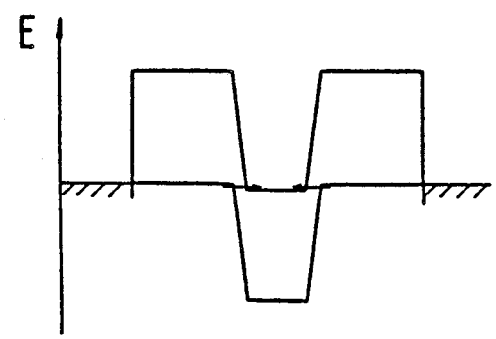
FIG. 9C is a energy band diagram in an ON state.
Figure 10:
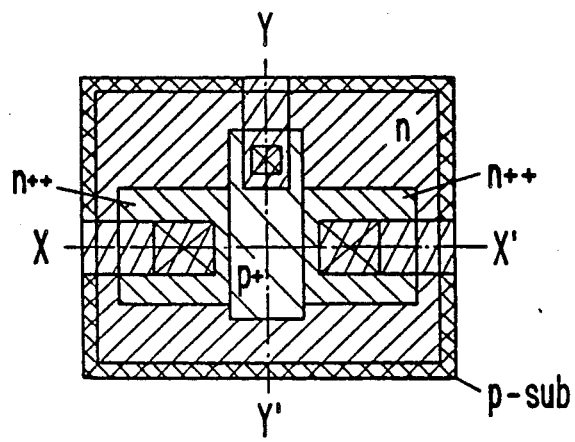
FIG. 10 is a plan view of V-ST.
Figure 11:
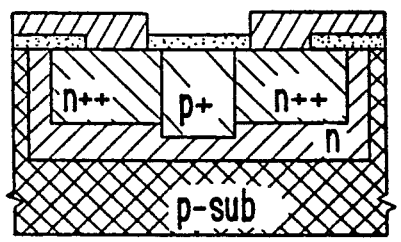
FIG. 11 is a sectional view of X—X' of FIG. 10.
Figure 12:
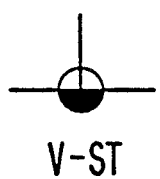
FIG. 12 is a sketch of a display symbol.
Figure 16A:
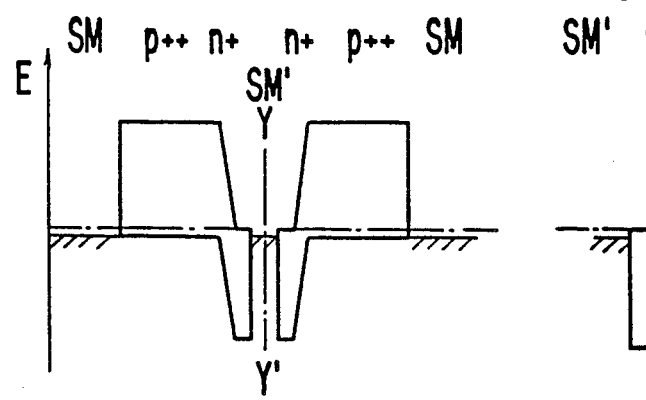
FIGS. 16A and 16B are energy band diagrams in a thermal balance state.
Figure 16B:
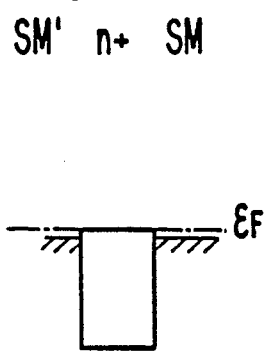
Figure 16C:
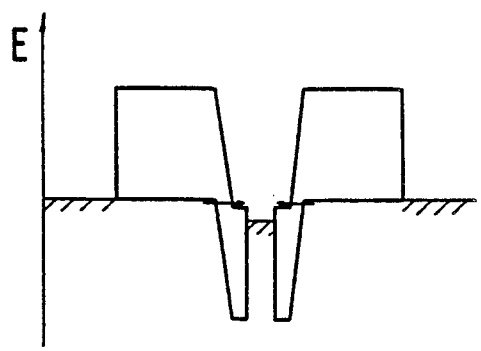
FIG. 16C is an energy band diagram in an ON state.
Figure 17:
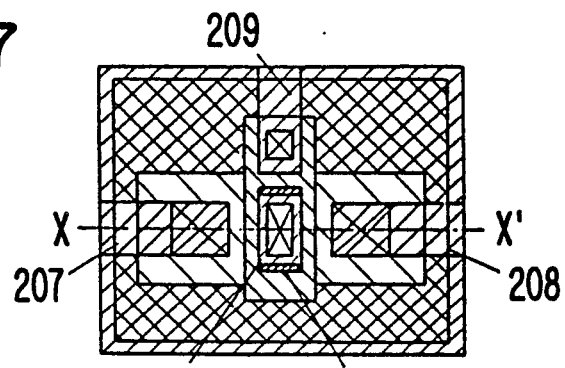
FIG. 17 is a plan view of a C-ST having a high purity concentration region disposed beneath the floating electrode in FIG. 14.
Figure 18:
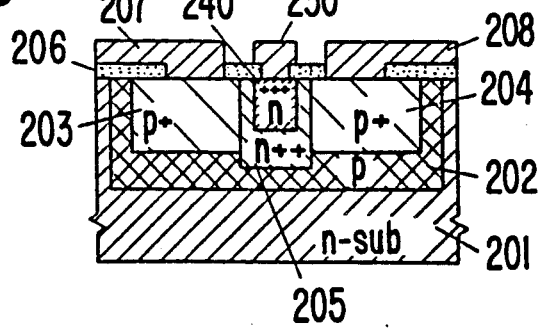
FIG. 18 is a sectional view of X—X' of FIG. 17.
Figures 19A, 19B:
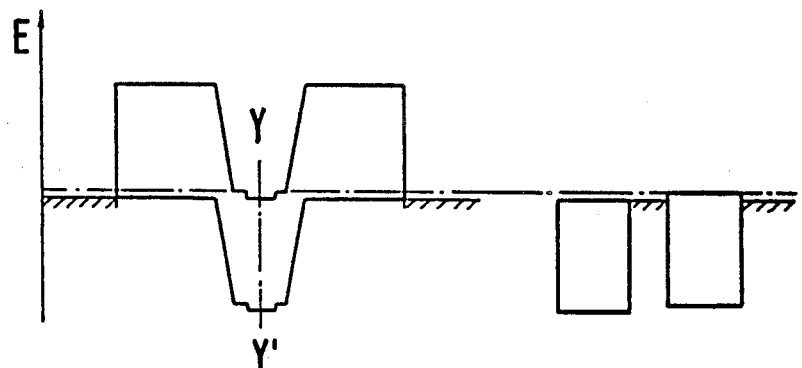
FIGS. 19A and 19B are energy band diagrams in a thermal balance state
Figure 19C:
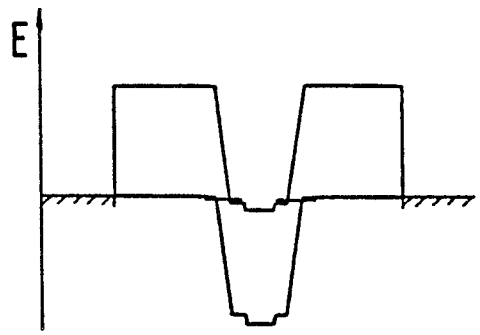
FIG. 19C is an energy band diagram in an ON state.

Referring first to FIGS. 6 to 9C, the gate of a conduction band channel superconductivity transistor (C-ST) is described below. FIG. 6 is a plan view, FIG. 7 is a sectional view of X—X' of FIG. 6, FIG. 8 is a graphic symbol of C-ST, FIGS. 9A and 9C are energy band diagrams along the section of X—X' of FIG. 6, and FIG. 9B is an energy band diagram long the section of X—X' of FIG. 6.

In FIGS. 6 and 7, a p-well 202 is formed on an n-substrate 201, and on the surface of the p-well 202, a p+ region 203 (a source region) and a p+ region 204 (a drain region) of a high impurity concentration ($10^{18}$ to $10^{19}$ cm$^{-3}$), and a n++ region (a gate region) of a high impurity concentration ($10^{19}$ to $10^{20}$ cm$^{-3}$) are formed, and a superconductive electrode 207 is connected to the p+ region 203 of source through a contact hole of the an insulating film 206, while a superconductive electrode 208 is connected to the p+ region 204 of drain, and a superconductive electrode 209 is connected to the n++ region 205 of the gate.

The distance "l" between the p+ region 203 of the source and the p+ region 204 of the drain (which is the length of the conduction band channel) has the relationship of $$l > \xi_{NS} + \xi_{ND} \ldots \quad (4)$$

between the coherence length $\xi_{NS}$ spreading from the p+ region 203 to the n++ region 205 by the superconductive electrode 207, and the coherence length $\xi_{ND}$ spreading from the p+ region 204 to the n+ region 206 by the superconductive electrode 208.

The distance "m" between the superconductive electrode 209 and the conduction band channel has the relationship of $$m > \xi_{NG} \ldots \quad (5)$$

against the coherence length $\xi_{NG}$ spreading in the n++ region 205 by the superconductive electrode, thereby avoiding interaction with the superconductive electron pair flowing between the source and drain.

The operation of the thus composed C-ST is described below. The energy band diagram of the thermal balance state of the C-ST shown in FIGS. 6 and 7 is shown in FIGS. 9A and 9B. At this time, the phases of the superconductive electron pairs spreading in the p+ region 203 of source and p+ region 204 of drain are not equal.

When a voltage approximately corresponding to Eg is applied to the superconductive electrode 209 of the gate, the superconductive electron pair having the tunneling probability of $$T = \exp\left[ -\frac{\pi}{8} \left( \frac{2m^*}{h^2} \right)^{\frac{1}{2}} \cdot \frac{E_g^{\frac{3}{2}}}{qF} \right] \quad (6)$$

where qF: gradient of energy band gap Eg tunnels from the valence band at the source and drain side to the conduction band at the gate side, as indicated by the arrows in the energy band diagram in FIG. 9C, and the phases are matched by the mutual interaction, so that conduction at the gate is realized.

In FIGS. 6 and 7, if the conductive types of the source, drain and gate regions are inverted, a similar theory is set up, which is called a valence band channel superconductivity transistor (V-ST). The structure of V-ST and energy band diagram are shown in FIGS. 10 to 13C.

As extended applications of the above structure, it may be considered, for example, to have an allowance for the channel length "l" by causing the superconductive electrode 230 in an electrically floating state to contact the surface of the n++ region 205 of the gate in FIGS. 6 and 7 (its structure and energy band diagrams are shown in FIGS. 14 to 16C), or to dispose an n+++ region 240 of high impurity concentration (over $10^{20}$ cm$^{-3}$) beneath the floating superconductive electrode so that the superconductive electron pairs may flow also beneath the interface of the semiconductor (its structure and energy band diagrams are shown in FIGS. 17 to 19B).

Thus, in the superconductive transistor of this embodiment making use of a the tunneling effect of pn junction, the tunneling probability can be controlled by the gate voltage, and the semiconductor region of high impurity concentration is intrinsically needed, so that the coherence length $\xi_N$ in equations (2) and (3) may be sufficiently maintained, which makes easy to design the gate portion. Moreover, since the tunneling of the superconductive electron pair is controlled by the voltage equivalent to the energy gap $E_B$ of superconductor, the performances of high speed and lower power consumption may be sufficiently exhibited.

FIGS. 20 to 23E refer to the structure and energy band diagrams of a complementary superconductive transistor in accordance into a second embodiment of the present invention.

When the superconductive electron pairs interact, if generation of quasiparticle is not recognized, the superconductive transistor intrinsically operates on binary action of on/off switching by the intense phase draw-in action of the electron pairs.

However, when attempted to cause on/off switching by one superconductive transistor, a stationary AC Josephson effect occurs, which results in formation of quasiparticles.

The complementary superconductive transistor is intended to make use of only DC Josephson effect (which corresponds to the operation realized by the first embodiment of the invention) only intrinsically, except for the transient generation of AC Josephson effect between ON and OFF moments.

Figure 20:
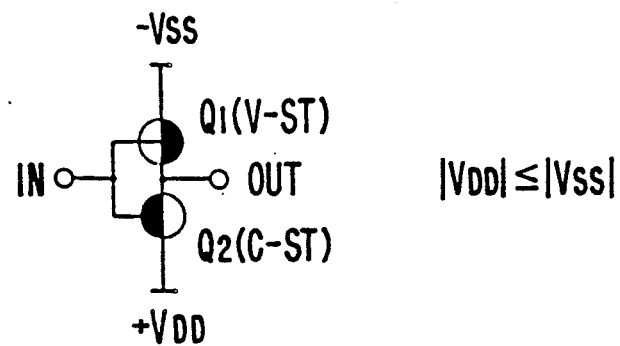
FIG. 20 is an equivalent circuit diagram of a COST in a second embodiment in accordance with the present invention.

FIG. 20 shows an inverter composed of a C-ST and a V-ST, which is a basic circuit when making up an integrated circuit by superconductive transistors.

Figure 21:
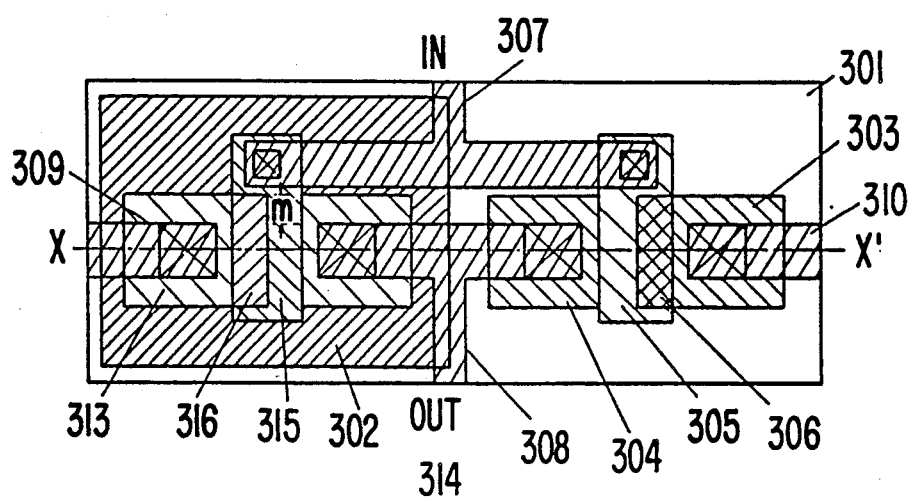
FIG. 21 is a plan view of a COST.
Figure 22:
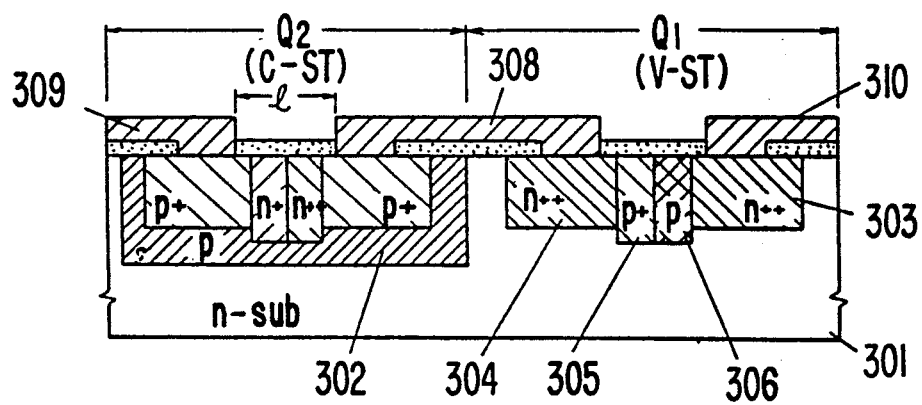
FIG. 22 is a sectional view of X—X' of FIG. 21.

FIGS. 21 and 22 show the structure of a complementary superconductive transistor (COST). The COST is composed of a C-ST, and a V-ST, but it is preferable to use the shown C-ST and V-ST directly (because they are not operated unless a voltage to cause quasiparticles is applied).

The C-ST and V-ST for composing the COST have the structure of the gate portion divided into two parts, so that a tunneling effect of superconductive electron pairs is always present between the drain region of the signal output side and the vicinity of drain of the gate region.

In FIGS. 21 and 22, a p-well 302 is formed on an n-substrate 301. The V-ST is composed of, on the surface of the n-substrate 301, an n++ region 303 (source region), an n++ region 304 (drain region), and a p++ region 304 (first gate region) of a high impurity concentration ($10^{19}$ to $10^{20}$ cm$^{-3}$) and a p+ region 306 (second gate region) of a high impurity concentration ($10^{18}$ to $10^{19}$ cm$^{-3}$), while the C-ST is composed of, on the surface of the p-well 302, a p+ region 313 (source region), a p+ region 314 (drain region), and an n+ region 316 (second gate region) of a high impurity concentration ($10^{18}$ to $10^{19}$ cm$^{-3}$), and a n++ region 315 (first gate region) of a high impurity concentration ($10^{19}$ to $10^{20}$ cm$^{-3}$).

For wiring between the C-ST and V-ST, the superconductive electrode 307 is connected to the n++ region 315 of the C-ST and the p++ region 305 of the V-ST, the superconductive electrode 308 is connected to the p+ region 314 of the C-ST and the n++ region 304 of the V-ST and the superconductive electrodes 309, 310 are respectively connected to the p+ region 313 of the C-ST and the n++ region 303 of the V-ST.

The channel length "l" and the interference preventive distance "m" may be regarded to be the same as in the first embodiment.

Figure 23A:
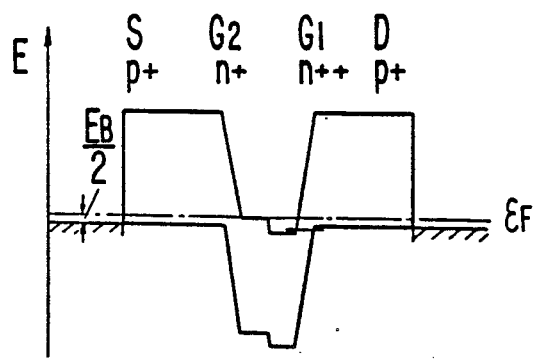
FIG. 23A is an energy band diagram in a thermal balance state of a C-ST portion of a COST.
Figure 23B:
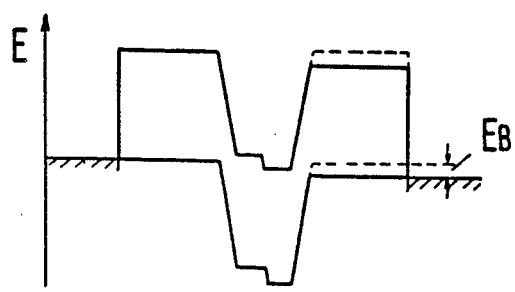
FIG. 23B is an energy band diagram of a C-ST portion when both a C-ST and a V-ST of a COST are in an OFF state.

The operation of thus composed COST is explained below. FIG. 23A is the energy band diagram in the thermal balance state of C-ST block shown in FIGS. 21 and 22. As clear from this diagram, a tunneling effect exists between the p+ region 314 of drain and n++ region 315 of first gate. When the state of V-ST is ON and the state C-ST is OFF of and the COST is changed to the state of the V-ST being OFF, the energy band becomes as shown in FIG. 23B. Supposing $V_{SS}=0V$, $V_{DD}=E_B/q$, at this time, the tunneling effect in FIG. 23A is lost.

Figure 23C:
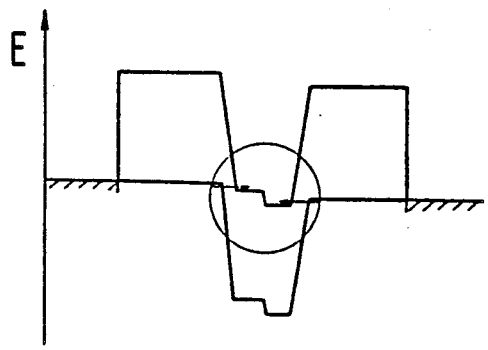
Figure 23D:
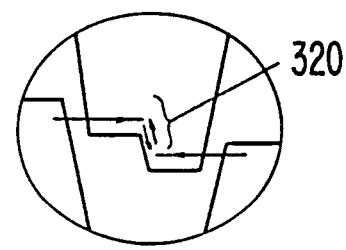
FIG. 23D is a magnified view of essential parts of FIG. 23C.
Figure 23E:
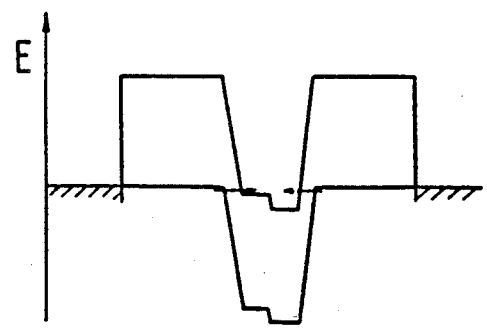
FIG. 23E is an energy band diagram in an ON state.

Here, when $V_G=V_{DD}$ is applied to the gate of C-ST, the energy band becomes as shown in FIG. 23C. FIG. 23D is a magnified view of the circled portion of FIG. 23C. As is obvious from the diagram, tunneling effects are present between the p+ region 314 of drain and the n++ region 315 of the first gate, and between p+ region 313 of the source and the n+ region 316 of the second gate. At this time, since the energy difference for causing tunneling effects is $E_B$, an AC Josephson effect is transiently present as indicated by arrows 320, and by the strong phase draw-in action occurring there, the energy level of the p+ region 314 of the electrically floating drain becomes equal to the energy level of the p+ region of the source, thereby instantly settling in the state shown in FIG. 23E.

The action of the V-ST may be similarly considered.

Thus, according to this embodiment, the inverter operation can be realized without utilizing the stationary AC Josephson effect, and, the designing technique of the CMOS circuit of the semiconductor may be directly applied. Besides, since DC power is used as the power supply, batteries can be used.

Incidentally, the semiconductor used in the foregoing embodiments may be monocrystalline, polycrystalline, or amorphous.

In the explanation of the operation noted above, the superconductive electron parts are exclusively mentioned, but it is possible to explain similarly by using superconductive hole pairs (it may be considered that the hole pairs move above the energy gap $E_B$ of the superconductor; in this case, the conductive type of the semiconductor must be inverted).

While specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

We claim:

1. A superconductive transistor comprising: a high resistance semiconductor region of a first type of conductivity; a source region and a drain region of said first type of conductivity at a high impurity concentration formed in said high resistance semiconductor region; a gate region of a second type of conductivity at a high impurity concentration formed between said source and drain regions, and a source electrode, drain electrode and gate electrode respectively connected to said source region, drain region and gate region; which said source, drain and gate electrodes are made of high temperature superconductive materials, and the dimensions and impurity concentrations are selected so that the coherence lengths $\xi_{NS}$, $\xi_{ND}$, $\xi_{NG}$ of the wave functions of superconductive electron pairs of said electrodes spreading within the semiconductor do not intersect in the thermal balance state, and wherein tunneling of the superconductive electron pairs may occur between the source and gate, and between the drain and gate when a voltage corresponding to the energy gap of said superconductive materials is applied to said gate electrode; wherein the drain side of said gate region is higher in its impurity concentration than the gate side thereof, and tunneling of superconductive electron pairs occurs between said drain and gate even in the thermal balance state.

2. A superconductive transistor according to claim 1, further comprising: a second high resistance semiconductor region of said second type of conductivity formed in said high resistance semiconductor region; a second source region and a second drain region of said second type of conductivity at a high impurity concentration formed in said second high resistance semiconductor region, and a gate region of said first type of conductivity at a high impurity concentration formed between said second source and drain regions; wherein said gate electrode forms an input unit by connecting said gate region and said second gate region, and said drain electrode forms an output unit by connecting said drain region and said second drain region, and said second source electrode is connected to said second source region to form an inverter circuit.

* * * * *